US009553061B1

(12) United States Patent
Letourneau et al.

(10) Patent No.: US 9,553,061 B1
(45) Date of Patent: Jan. 24, 2017

(54) WIRING BOND PAD STRUCTURES

(71) Applicant: GLOBALFOUNDRIES INC., Grand Cayman (KY)

(72) Inventors: Donald R. Letourneau, Winooski, VT (US); Patrick S. Spinney, Charlotte, VT (US); Leah J. Bagley, Milton, VT (US); John M. Sutton, Essex Junction, VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/946,208

(22) Filed: Nov. 19, 2015

(51) Int. Cl.

| | |
|---|---|
| ***H01L 23/00*** | (2006.01) |
| ***H01L 21/66*** | (2006.01) |
| ***H01L 21/311*** | (2006.01) |

(52) U.S. Cl.
CPC ............. *H01L 24/06* (2013.01); *H01L 21/311* (2013.01); *H01L 22/32* (2013.01); *H01L 24/03* (2013.01); *H01L 2224/03622* (2013.01); *H01L 2224/04042* (2013.01); *H01L 2224/06515* (2013.01)

(58) Field of Classification Search
CPC ........... H01L 24/06; H01L 24/03; H01L 22/32
See application file for complete search history.

(56) References Cited

U.S. PATENT DOCUMENTS 5,380,401 A 1/1995 Jones et al.
6,063,207 A 5/2000 Yu et al.
6,383,909 B1 5/2002 Nagaya et al.
6,765,277 B2 7/2004 Chen et al.
6,890,828 B2 * 5/2005 Horak ................. H01L 21/7682 257/522
7,067,433 B2 6/2006 Fu et al.
7,098,544 B2 * 8/2006 Edelstein ............ H01L 23/3121 257/642
8,293,431 B2 * 10/2012 Rolff ....................... G03F 1/144 430/5
8,603,910 B2 12/2013 Koitz et al.
2002/0050629 A1 * 5/2002 Seshan .............. H01L 21/76825 257/632
2005/0001316 A1 1/2005 Dean et al.
2005/0136662 A1 6/2005 Tsai et al.
2009/0059656 A1 * 3/2009 Kanakasabapathy . H01L 23/544 365/158

(Continued)

FOREIGN PATENT DOCUMENTS

WO WO0021132 A1 4/2000

OTHER PUBLICATIONS

Mautz et al., "Elimination of bond pad corrosion caused by solvent exposure", Proceedings of the Third International Symposium on Corrosion and Reliability of Electronic Materials and Devices (The Electrochemical Society), 1994, vol. 94, No. 29, pp. 253-259.

*Primary Examiner* — Ida M Soward
(74) *Attorney, Agent, or Firm* — David Cain; Andrew M. Calderon; Roberts Mlotkowski Safran Cole & Calderon. P.C.

(57) ABSTRACT

The present disclosure relates to semiconductor structures and, more particularly, to wire bond pad structures and methods of manufacture. The structure includes: bond pads in an active region of a chip; test pad structures in a kerf region of the chip; and hardmask material in the kerf region between the test pad structures and the bond pads. The surfaces of the test pad structures and the bond pads are devoid of the hardmask material.

9 Claims, 2 Drawing Sheets

10
15
45
30
40
20
50
25
40

(56) References Cited

U.S. PATENT DOCUMENTS

2010/0184285 A1 7/2010 Hua et al.
2014/0116760 A1 5/2014 Wang
2015/0137144 A1* 5/2015 Engelhardt ......... H01L 21/8234
257/77
2016/0260674 A1* 9/2016 Jones .................... H01L 23/544

* cited by examiner

WIRING BOND PAD STRUCTURES

FIELD OF THE INVENTION

The present disclosure relates to semiconductor structures and, more particularly, to wire bond pad structures and methods of manufacture.

BACKGROUND

In the fabrication of modern semiconductor devices or integrated circuits (ICs), one or more contact pads (e.g., bond pads) are provided to electrically contact the device or circuit to/from the outside. Pad treatment processes (also referred to as pad conditioning processes) are needed to provide defined pad surfaces that may, for example, be insensitive to corrosion by environmental conditions and suitable for further processing such as wafer thinning, backside metallization, wire bonding, etc.

SUMMARY

In an aspect of the disclosure, a structure includes: bond pads in an active region of a chip; test pad structures in a kerf region of the chip; and hardmask material in the kerf region between the test pad structures and the bond pads. The surfaces of the test pad structures and the bond pads are devoid of the hardmask material.

In an aspect of the disclosure, a structure includes: a plurality of bond pads in an active region of a chip; a plurality of test pad structures in a kerf region of the chip; and hardmask material in the kerf region surrounding the plurality of test pad structures.

In an aspect of the disclosure, a method includes: forming a plurality of bond pads in an active region of a chip; forming a plurality of test pad structures in a kerf region of the chip; forming hardmask material over the plurality of bond pads and test pad structures; and removing selective portions of the hardmask material within the kerf region to expose surfaces of the test pad structures and in the active region to expose surfaces of the plurality of bond pads.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to bond pad structures and methods of manufacture. More specifically, the present disclosure describes fabrication processes which provide bond pad structures with high quality bond pad surfaces. For example, in embodiments, the fabrication processes describe herein provide high quality bond pad surfaces for wiring bond pads and other types of bond pads located adjacent a kerf region.

In conventional processes, sputtering processes are performed to open the entire kerf region for quality dicing operations. The sputtering process is also used to expose test pads in the kerf, which are used to obtain Process Control Monitoring (PCM) data. However, it has been found by the inventors that sputtering processes in the electrical kerf region unexpectedly result in poor quality bond pad surfaces. For example, after physical analysis and inspection, it was found by the inventors that abnormal surface texturing (e.g., discoloring) occurs on the bond pads adjacent to the kerf region after the sputtering process has been completed. This abnormal surface texturing is believed to be due to localized RIE chemistry (e.g., sputtering) in a large open area in the PCM region of the wafer, e.g., within the kerf region. More specifically, it is believed that the sputtering chemistry used to remove hardmask material, e.g., polyimide, in the kerf region for wafer dicing operations results in abnormal surface texturing of the bond pads located adjacent to the kerf area. For example, sputtering processes performed in the electrical kerf region can discolor the bond pads, causing poor quality bond pad surfaces. This problem has now been solved by the inventors through the processes described herein.

The structures described in the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
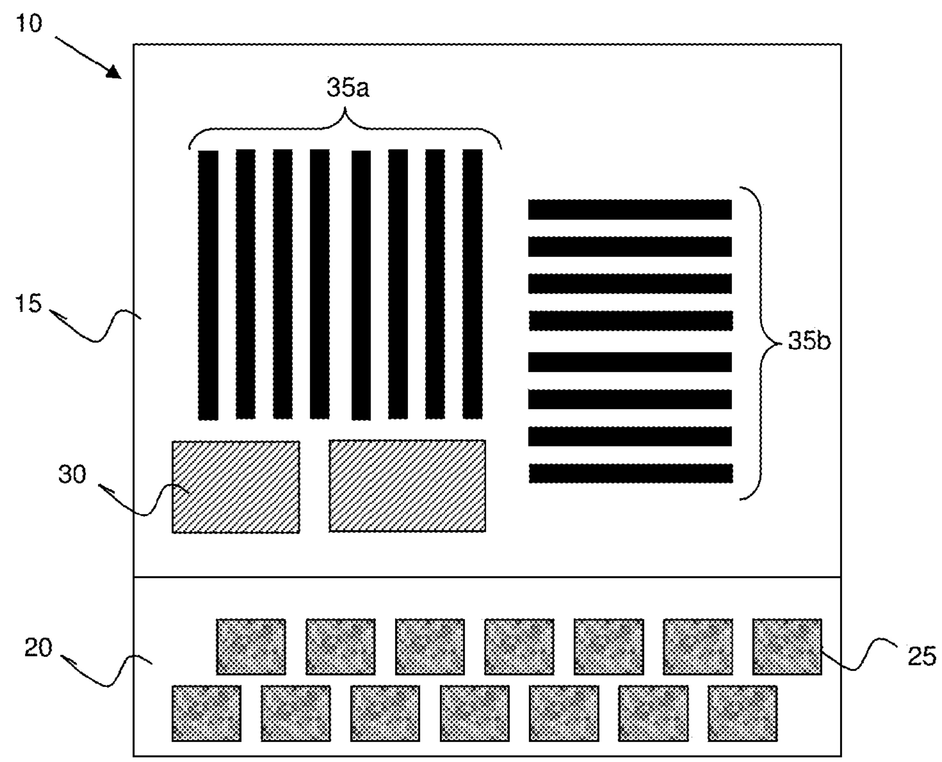
FIG. 1 shows a top view of an integrated circuit with bond pads and test pad structures, amongst other features, in accordance with aspects of the present disclosure.

FIG. 1 shows a top view of an integrated circuit with bond pads and test pad structures, amongst other features, in accordance with aspects of the present disclosure. In particular, FIG. 1 shows a chip or integrated circuit 10 which includes an active region 15 and a kerf region 20. In embodiments, test pad structures 25 are fabricated at predefined test-sites within the kerf region 20. As should be understood by those of skill in the art, the test pad structures 25 are provided in the kerf region 20 so as to not take up valuable chip space in the active region 15. The test pad structures 25 may be identical in configuration or may have different configurations, and are fabricated using conventional metal deposition (e.g., copper, aluminum, metal alloys, etc.), lithography and etching processes known to those of skill in the art such that no further explanation is needed to understand the invention. The test pad structures 25 are also preferably electrically insulated from one another.

Typically, one set of test pad structures 25 is placed for every reticule (e.g., area covered by one lithography exposure); although other configurations are contemplated herein. In embodiments, the test pad structures 25 can be used to collect data at the end of actual wafer fabrication process, e.g., PCM data. In many cases, the data collected from the test pad structures 25 can provide an early warning of a potential problem that may happen after expensive operations such as test and assembly.

FIG. 1 further shows BEOL structures in the active area 15. These BEOL structures include, e.g., bond pads 30, wire interconnects and other wiring structures as represented by reference numerals 35*a*, 35*b*. As shown representatively in FIG. 1, the bond pads 30 are located adjacent to the kerf region 20 and, hence, near the test pad structures 25. In embodiments, the bond pads 30 are formed from metal or metal alloy materials. These metals or metal alloy materials can include, e.g., copper, aluminum, gold, silver, etc., fabricated using conventional metal deposition, lithography and etching processes known to those of skill in the art. In embodiments, the bond pads 30 can be formed with a combination of metal layers within a substrate or layers of material formed over the substrate, e.g., passivation layers, adhesion layers, insulation layers, etc., as should already be understood by those of skill in the art.

In embodiments, the bond pads 30 can be wire bond pads, as an example. In wire bonding, interconnections can be made between the integrated circuit (IC) 10 and its packaging during semiconductor device fabrication. Wire bonding is generally considered the most cost-effective and flexible interconnect technology, and is used to assemble the vast majority of semiconductor packages.

Figure 2:
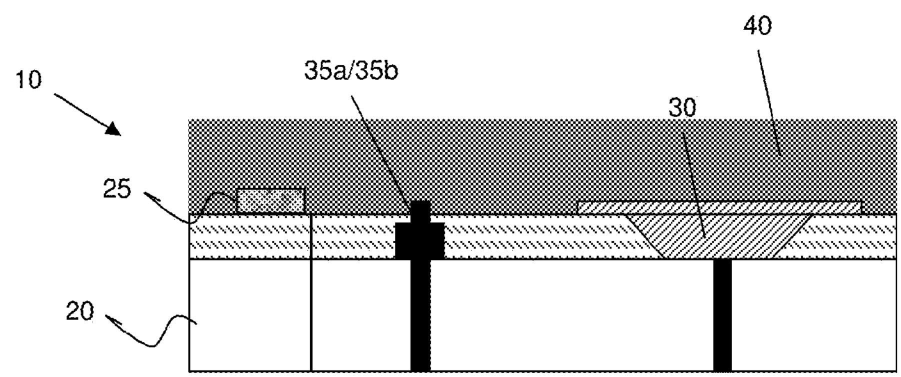
FIG. 2 shows a cross-sectional view of the integrated circuit of FIG. 1, with a hardmask layer over the bond pads and test pad structures in accordance with aspects of the present disclosure.

FIG. 2 shows a cross-sectional view of the integrated circuit 10 of FIG. 1, with a hardmask material 40 formed over the bond pads 30 and test pad structures 25 in accordance with aspects of the present disclosure. In embodiments, the hardmask material 40 can be a polyimide material used with BEOL structures to protect underlying metal interconnects and other structures as represented by reference numeral 35*a*, 35*b*. As should be understood by those of skill in the art, the polyimide 40 has good mechanical elongation and tensile strength, which also helps the adhesion between the polyimide and deposited metal layers, e.g., interconnect and other metal structures as represented by reference numerals 35*a*, 35*b*. The interaction between the metals and the polyimide, coupled with high temperature stability of the polyimide, results in a system that provides reliable insulation when subjected to various types of environmental stresses.

Figure 3:
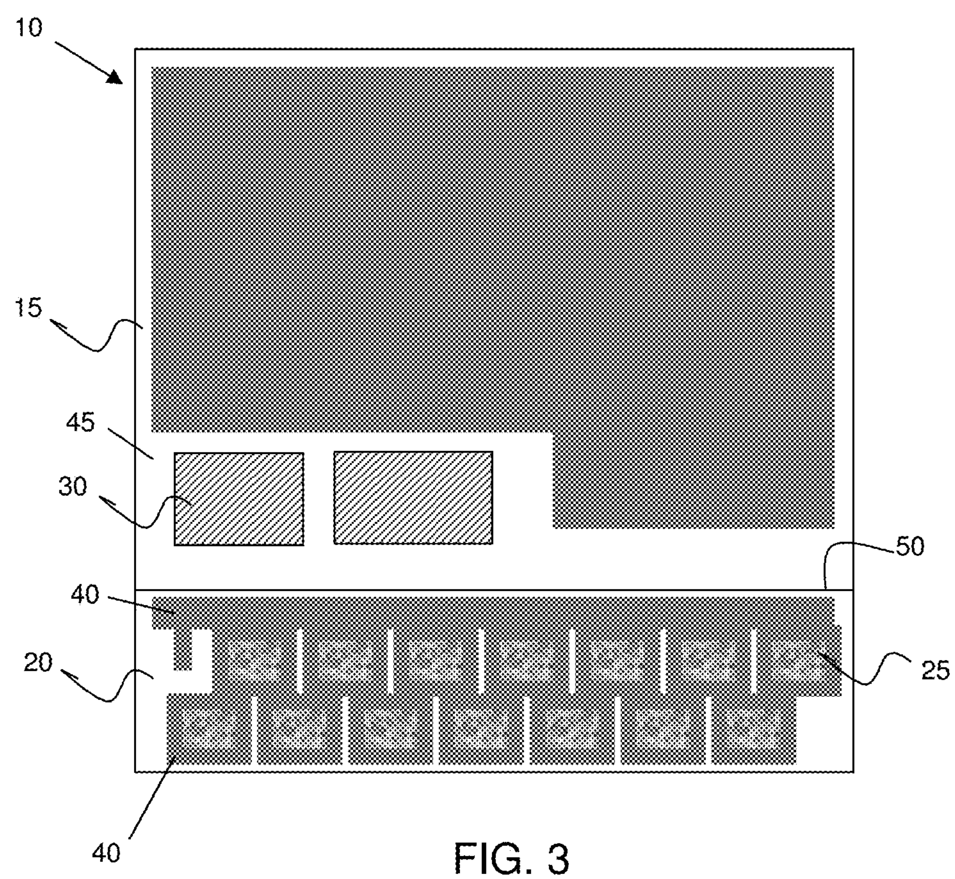
FIG. 3 shows a top view of an integrated circuit with openings in the hardmask layer to expose the bond pads and test pad structures in accordance with aspects of the present disclosure.

FIG. 3 shows a top view of the integrated circuit of FIG. 1, with openings in the hardmask layer to expose the bond pads 30 and test pad structures 25 in accordance with aspects of the present disclosure. More specifically, in embodiments, through a sputtering process with known chemistries, selected portions of the hardmask material 40 can be removed to expose the bond pads 30 (within the kerf region 20) and the test pad structures 25. As a departure from conventional processes, though, only selected portions of the hardmask material 40 within the kerf region 20 will be removed by the sputtering process; that is, as shown in FIG. 3, the sputtering process will expose surfaces of the test pad structures 25, leaving hardmask material 40 surrounding the test pad structures 25 within the kerf region 20.

In embodiments, the hardmask material 40 will be remain about portions of the perimeter of the test pad structures 25, particularly between the bond pads 30 (within the kerf region 20) and the test pad structures 25. In more specific embodiments, the hardmask material 40 will be remain completely about a perimeter of the test pad structures 25. In this way, hardmask material 40 will be present between the test pad structures 25 within the kerf region 20 and the bond pads 30. The sputtering process will also remove only enough hardmask material 40 within the kerf region 20 needed to ensure quality dicing operations. For example, the hardmask material 40 is removed from selected portions of the kerf region along a scribe line 50. Thus, unlike conventional processes, the sputtering process described herein will not remove all of the hardmask material 40 within the kerf region 20.

In embodiments, the sputtering process is provided through a lithography and etching process. More specifically, the sputtering process includes a lithography step followed by an etching process (e.g., reactive ion etching (RIE)). The lithography step includes the deposition of a resist material, which is exposed to energy (e.g., light) through a mask. Although the mask requires additional complexity and costs due to the need for the resist material to be patterned to maintain coverage over selected regions of the hardmask material 40 within the kerf region 20, e.g., around the test pad structures 25, it has been found by the inventors to be worthwhile as yields can be significantly improved. Specifically, the patterning will eliminate abnormal surface texturing (e.g., discoloring) on the bond pads 30 adjacent to the kerf region 20 even after the sputtering process has been completed.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:

bond pads in an active region of a chip;

test pad structures in a kerf region of the chip; and hardmask material in the kerf region between the test pad structures and the bond pads, wherein surfaces of the test pad structures and the bond pads are devoid of the hardmask material.

2. The structure of claim 1, wherein the bond pads are adjacent to the kerf region.

3. The structure of claim 1, wherein the hardmask material is polyimide.

4. The structure of claim 1, wherein the hardmask material surrounds the test pad structures in the kerf region.

5. The structure of claim 4, wherein the hardmask material completely surrounds a perimeter of the test pad structures in the kerf region.

6. The structure of claim 1, wherein the hardmask material is removed from selected portions of the kerf region along a scribe line.

7. The structure of claim 1, wherein surfaces of the test pad structures are exposed.

8. The structure of claim 1, wherein the surfaces of the bond pads are not discolored.

9. The structure of claim 1, further comprising back end of the line structures within the active region.

* * * * *